(12) United States Patent
Chen et al.

(10) Patent No.: US 7,525,155 B2
(45) Date of Patent: Apr. 28, 2009

(54) HIGH VOLTAGE TRANSISTOR STRUCTURE FOR SEMICONDUCTOR DEVICE

(75) Inventors: Fu-Hsin Chen, Gaoshu Township, Pingtung County (TW); Ruey-Hsin Liu, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 301 days.

(21) Appl. No.: 11/387,573

(22) Filed: Mar. 23, 2006

(65) Prior Publication Data

US 2006/0163626 A1 Jul. 27, 2006

Related U.S. Application Data

(62) Division of application No. 10/723,771, filed on Nov. 26, 2003, now Pat. No. 7,045,414.

(51) Int. Cl.
*H01L 29/94* (2006.01)
*H01L 29/74* (2006.01)

(52) U.S. Cl. .................. 257/347; 257/349; 257/162

(58) Field of Classification Search .......... 257/347, 257/349, 162, 163, 164, 151, 175
See application file for complete search history.

(56) References Cited

U.S. PATENT DOCUMENTS 5,436,483 A 7/1995 Iwai et al.
6,091,111 A 7/2000 Demirlioglu et al.
6,124,159 A 9/2000 Chu
6,144,538 A * 11/2000 Chao ...................... 361/56
6,277,694 B1 8/2001 Wu
6,297,108 B1 * 10/2001 Chu ...................... 438/297
6,333,234 B1 * 12/2001 Liu ...................... 438/307
6,350,641 B1 2/2002 Yang
6,713,338 B2 3/2004 Wang et al.
6,815,320 B2 11/2004 Kim et al.
2005/0112826 A1 5/2005 Chen et al.
2005/0118768 A1 6/2005 Chen
2005/0142717 A1 6/2005 Rabkin et al.

* cited by examiner

*Primary Examiner*—Walter L Lindsay, Jr.
(74) *Attorney, Agent, or Firm*—Slater & Matsil, L.L.P.

(57) ABSTRACT

A high voltage MOS transistor has a thermally-driven-in first doped region and a second doped region that form a double diffused drain structure. Boundaries of the first doped region are graded. A gate-side boundary of the first doped region extends laterally below part of the gate electrode. The second doped region is formed within the first doped region. A gate-side boundary of the second doped region is separated from a closest edge of the gate electrode by a first spaced distance. The gate-side boundary of the second doped region is separated from a closest edge of the spacer by a second spaced distance. The first spaced distance is greater than the second spaced distance. An isolation-side boundary of the second doped region may be separated from an adjacent isolation structure by a third spaced distance.

19 Claims, 4 Drawing Sheets

US 7,525,155 B2

HIGH VOLTAGE TRANSISTOR STRUCTURE FOR SEMICONDUCTOR DEVICE

This application is a divisional of patent application Ser. No. 10/723,771, entitled *Method Of Fabricating High Voltage Transistor*, filed on Nov. 26, 2003, now U.S. Pat. No. 7,045,414 which application is incorporated herein by reference.

TECHNICAL FIELD

The present invention generally relates to semiconductor devices. In one aspect it relates more particularly to a method of fabricating a high voltage metal-oxide semiconductor transistor on a semiconductor wafer.

BACKGROUND

A double diffused drain (DDD) may be used as a source and/or drain in a high voltage metal-oxide semiconductor (HVMOS) transistor to provide a high breakdown voltage and to prevent electrostatic discharge that may result in the destruction of a semiconductor device. Hot electron effects may be caused by shorted channel lengths in a MOS transistor. Using a DDD may also provide a solution to hot electron effects and prevent electrical breakdown in the source/drain under high voltage loading.

Many prior HVMOS transistors have a shallow junction depth for the DDD region. Such transistors having a shallow junction depth for the DDD region may provide a breakdown voltage of only about 22 volts, and thus may only be used reliably for a device with an operating voltage between about 12 volts and about 16 volts, for example. Yet, it would be desirable in many cases to provide an HVMOS transistor with a higher breakdown voltage and a higher limit on the operating voltage. Also, it would be desirable to provide such an HVMOS transistor while making little or no changes to a current process flow used in forming an HVMOS transistor while forming a low-voltage MOS transistor in parallel.

SUMMARY OF THE INVENTION

The problems and needs outlined above may be addressed by embodiments of the present invention. In accordance with one aspect of the present invention, a method of fabricating a transistor is provided. This method includes the following steps described in this paragraph, and the order of the steps may vary.

In accordance with another aspect of the present invention, a method of fabricating a transistor is provided. This method includes the following steps described in this paragraph, and the order of the steps may vary. A substrate is provided, which includes an isolation region and an active region. The isolation region includes an insulating material formed at least partially in the substrate. A first patterned mask layer is formed over the initial structure. The first patterned mask layer has a first opening formed therein at a first location in the active region. Ions are implanted into the substrate at the first location through the first opening to form a first doped region. The first patterned mask layer is removed. The implanted ions of the first doped region are thermally driven in further into the substrate to enlarge the first doped region and to make boundaries of the first doped region graded. A gate electrode is formed over the substrate after the driving in step. At least part of the gate electrode is located in the active region, and at least part of the gate electrode extends over a part of the first doped region. Ions are implanted into the substrate at the active region in alignment with edges of the gate electrode and edges of the isolation region to form a lightly doped region. A spacer is formed along the edges of the gate electrode to form an intermediate structure. The spacer extends over part of the lightly doped region. A second patterned mask layer is formed over the intermediate structure. The second patterned mask layer has a second opening formed therein at a second location in the active region. The second location is located within the first location. Ions are implanted into the substrate at the second location through the second opening to form a second doped region within the first doped region. A gate-side boundary of the second doped region is separated from a closest edge of the gate electrode by a first spaced distance. The gate-side boundary of the second doped region is separated from a closest edge of the spacer by a second spaced distance. The second spaced distance is less than the first spaced distance. The second opening is not aligned with the closest edge of the spacer.

In accordance with still another aspect of the present invention, a method of fabricating a transistor is provided. This method includes the following steps described in this paragraph, and the order of the steps may vary. An active region is defined, wherein at least part of the active region extends into the substrate. An isolation region is formed. At least a majority of the isolation region extends at least partially around the active region. The isolation region includes an insulating material formed at least partially in the substrate. A first patterned mask layer is formed over the substrate. The first patterned mask layer has a first opening formed therein at a first location in the active region. Ions are implanted into the substrate at the first location through the first opening to form a first doped region. The first patterned mask layer is removed. The implanted ions of the first doped region are thermally driven in further into the substrate to enlarge the first doped region and to make boundaries of the first doped region graded. A gate electrode is formed over the substrate after the driving in step. At least part of the gate electrode is located in the active region, and at least part of the gate electrode extends over a part of the first doped region. Ions are implanted into the substrate at the active region in alignment with edges of the gate electrode and edges of the isolation region to form a lightly doped region. A spacer is formed along the edges of the gate electrode to form an intermediate structure. The spacer extends over part of the lightly doped region. A second patterned mask layer is formed over the intermediate structure. The second patterned mask layer has a second opening formed therein at a second location in the active region. The second location is located within the first location. Ions are implanted into the substrate at the second location through the second opening to form a second doped region within the first doped region. A gate-side boundary of the second doped region is separated from a closest edge of the gate electrode by a first spaced distance. The gate-side boundary of the second doped region is separated from a closest edge of the spacer by a second spaced distance. The second spaced distance is less than the first spaced distance. The second opening is not aligned with the closest edge of the spacer. The forming of the isolation region may be performed before the forming of the first patterned mask layer. Alternately, the isolation region may be formed at any time after the driving in step.

In accordance with yet another aspect of the present invention, a semiconductor device is provided, which includes a substrate, a volume defined as being an active region, an isolation region, a gate electrode, a spacer, a thermally-driven-in first doped region, and a second doped region. At least part of the active region extends into the substrate. The isolation region includes an insulating material formed at least partially in the substrate. At least a majority of the isolation region extends at least partially around the active region. The gate electrode is formed over the substrate. At least part of the gate electrode is located in the active region. The spacer is formed along edges of the gate electrode. The thermally-driven-in first doped region is formed in the substrate. Boundaries of the first doped region are graded. A gate-side boundary of the first doped region extends laterally below part of the gate electrode. The second doped region is formed within the first doped region. A gate-side boundary of the second doped region is separated from a closest edge of the gate electrode by a first spaced distance. The gate-side boundary of the second doped region is separated from a closest edge of the spacer by a second spaced distance. The first spaced distance is greater than the second spaced distance.

In accordance with another aspect of the present invention, a semiconductor device is provided, which includes a transistor. The transistor includes a gate electrode, a spacer, and a drain region. The spacer is formed along edges of the gate electrode. The spacer has an outer edge. The drain region includes a first doped region and a second doped region. At least part of the first doped region is underlying at least part of the gate electrode. The second doped region is formed in the first doped region and spaced from the gate electrode a greater distance than from the outer edge of the spacer.

In accordance with still another aspect of the present invention, a semiconductor device is provided, which includes a high voltage transistor having a breakdown voltage equal to or greater than about 30 volts. The transistor includes a gate electrode, a spacer, a well region, and a drain region. The spacer is formed along edges of the gate electrode. The spacer has an outer edge. The drain region includes a first doped region and a second doped region. The first doped region is formed in the well region. At least part of the first doped region is underlying at least part of the gate electrode. The first doped region has an opposite doping type than the well region. A depletion region between the first doped region and the well has a width between about 0.8 mm and about 1.0 mm when a bias of about 12 volts is applied. The second doped region is formed in the first doped region and spaced from the gate electrode a greater distance than from the outer edge of the spacer.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1A:
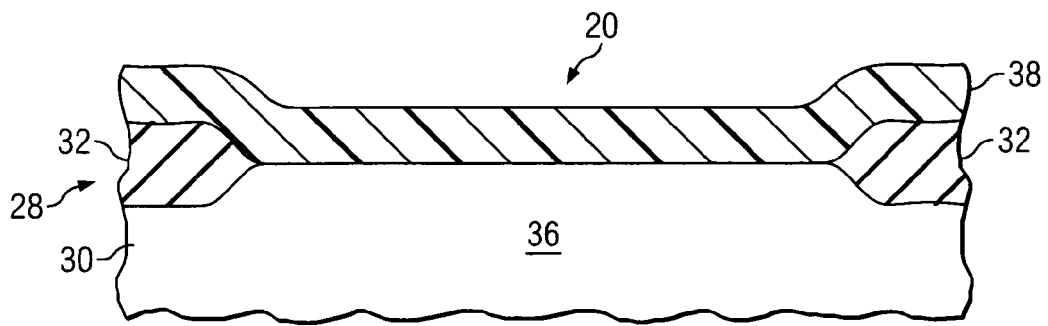
FIGS. 1A, 2A, 3A, 4A, 5A, and 6A show cross-section views of a low voltage MOS transistor being formed during a method for a preferred embodiment of the present invention.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIGS. 1A-6C illustrate an example process of fabricating an HVMOS transistor while, in parallel, fabricating a low-voltage MOS transistor in accordance with a preferred embodiment of the present invention. While describing FIGS. 1A-6C, active regions 20, 22 for a low-voltage portion 24 and a high-voltage portion 26 will be shown as each structure progresses through the illustrative process.

Figure 1B:
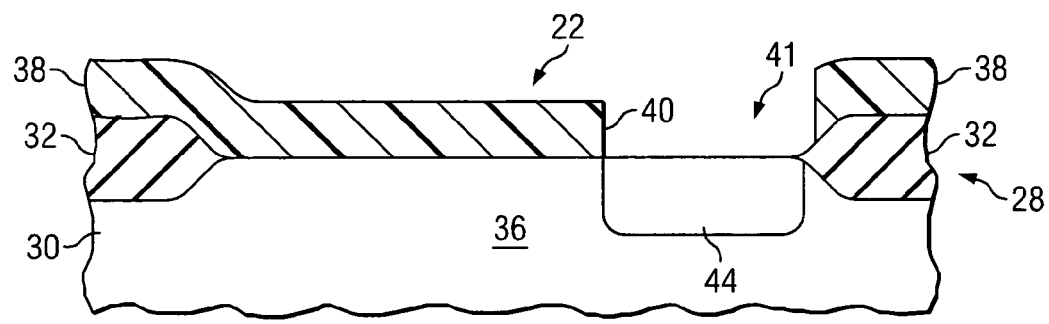
FIGS. 1B, 2B, 3B, 4B, 5B, and 6C show cross-section views of an HVMOS transistor being formed during a method for a preferred embodiment of the present invention, which may be performed in parallel with the steps shown in FIGS. 1A, 2A, 3A, 4A, 5A, and 6A.

Referring to FIGS. 1A and 1B, which respectively show a low-voltage portion 24 and a high-voltage portion 26, this description begins with an initial structure 28 that has had other preliminary and/or conventional processing steps performed on it. The initial structure 28 has a substrate 30, which may have isolation regions 32 formed therein. In this example, the isolation regions 32 have been formed at the beginning of the process, which is typically preferred. In other embodiments, however, the isolation regions 32 may be formed at a later stage in the process. In this example, the isolation regions 32 have a field oxide structure. But as described further below, the isolation regions 32 may be formed with other structures, such as a shallow trench isolation structure, for example. In this example, the isolation regions 32 surround and define boundaries for the active regions 20, 22 where the transistors will reside. Often the isolation regions 32 have a generally rectangular box shape from a top view (not shown), for example.

The substrate 30 of the initial structure 28 preferably has P/N type well regions 36 at the active regions 20, 22 where the transistors will be formed. "P/N" indicates that the well region 36 may be P type or N type. In FIGS. 1A and 1B, the initial structure 28 has a first patterned mask layer 38 formed thereon. The first mask layer 38 may be made from any of a variety of suitable masking materials, such as photoresist, for example. The first mask layer 38 has a first opening 40 formed therein (e.g., by photolithography and etching) at a first location 41 of the high-voltage portion 26. As shown in FIG. 1B, the substrate 30 may be implanted with ions at the first location 41 through the first opening 40 to form a first doped region 44. The first doped region 44 may be N type or P type. Typically, if the substrate 30 has a P type well region 36, the first doped region 44 will be an N type doped region. And vice versa, if the substrate 30 has an N type well region 36, the first doped region 44 likely will be a P type doped region. The first mask layer 38 is preferably removed next.

Figure 2A:
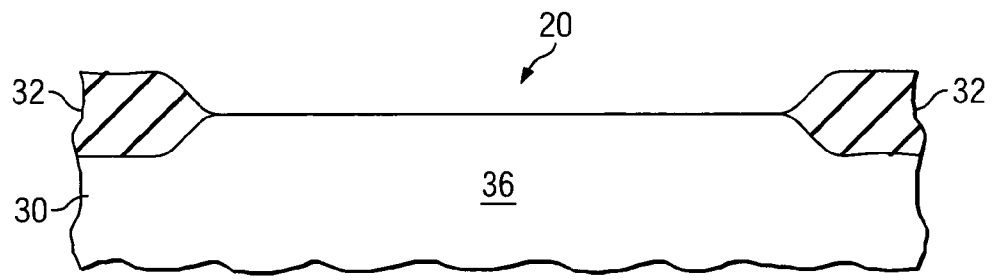
Figure 2B:
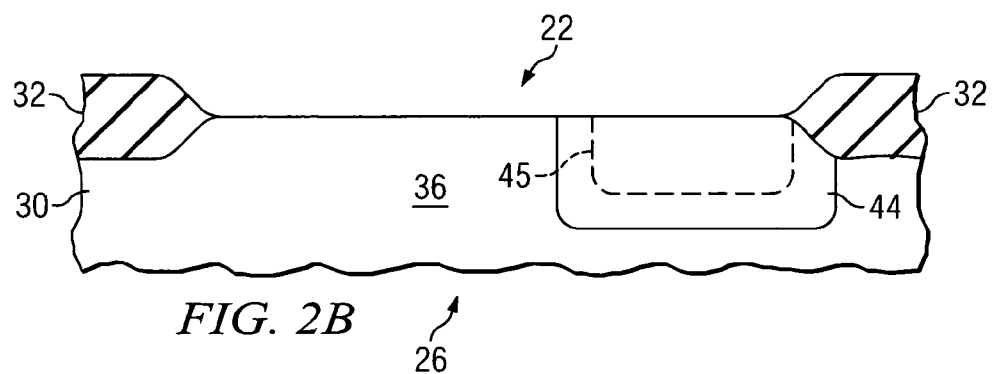

Referring to FIGS. 2A and 2B, the first doped region 44 may be enlarged by driving in the implanted ions further into the substrate 30. In FIG. 2B, the former size of the first doped region 44 prior to the thermal driving in step is shown in phantom lines 45 for purposes of illustrating the enlargement. The thermal driving in step may be performed at a temperature between about 1000° and about 1200° C., for example. Using a temperature of about 1100° C. is preferred for the thermal driving in step. The thermal driving in step may be performed for about 6-8 hours at atmospheric pressure, for example. As a result of the thermal driving in step, boundaries of the first doped region 44 become graded, which is desirable for many HVMOS transistor applications. In FIGS. 2A and 2B, the first mask layer 38 has been removed. The first mask layer 38 may be removed before, during, and/or after the thermally driving in step.

Figure 3A:
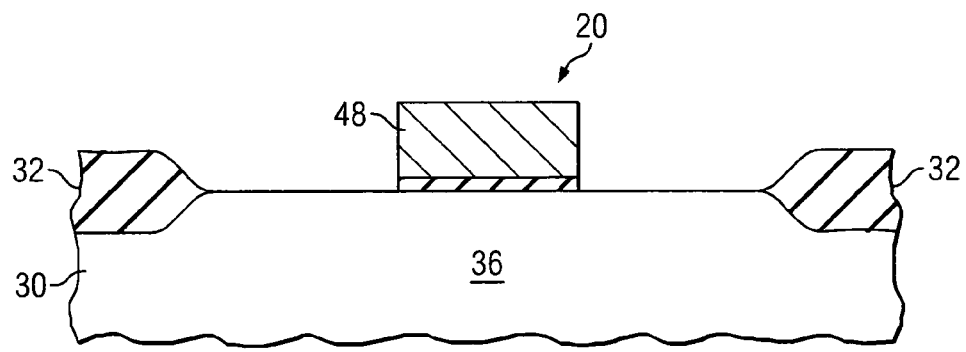
Figure 3B:
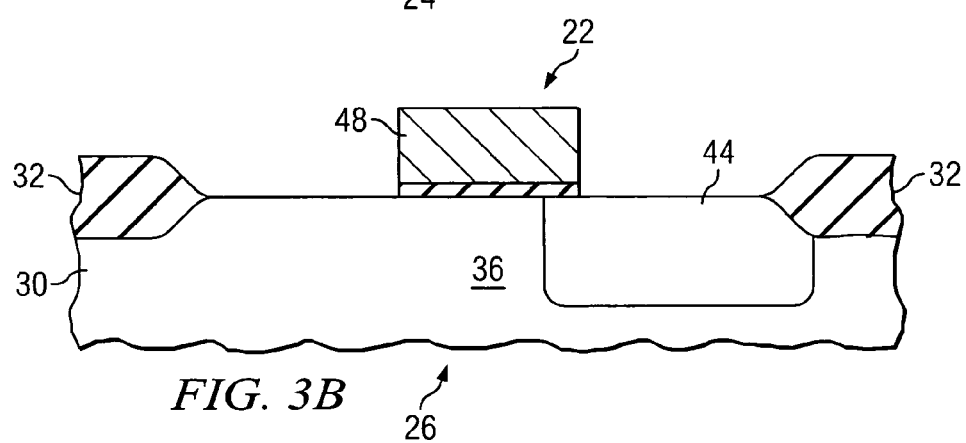

Next referring to FIGS. 3A and 3B, a gate electrode 48 is formed over the substrate 30 for each portion 24, 26 after the thermally driving in step. For each portion 24, 26, at least part of the gate electrode 48 is located in the active region 20, 22. At the high-voltage portion 26, at least part of the gate electrode 48 extends over a part of the first doped region 44, as shown in FIG. 3B. Although it may be preferable to form the gate electrode 48 after the thermally driving in step (as shown here), in other embodiments the gate electrode 48 may be formed before the thermally driving in step or before the implanting of ions for the first doped region 44, for example.

Figure 4A:
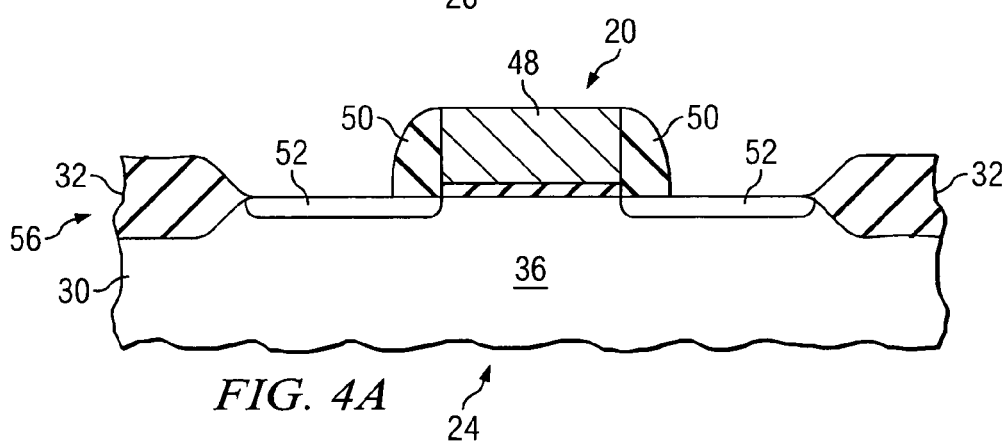
Figure 4B:
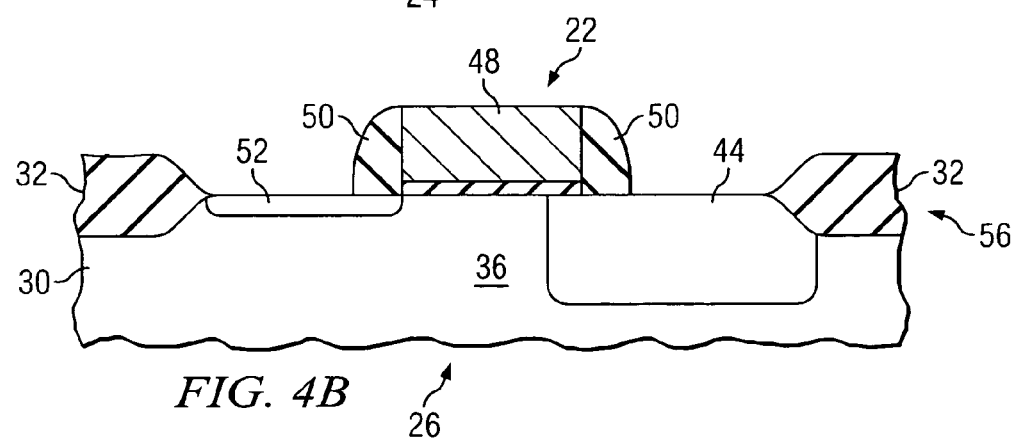

Leading up to FIGS. 4A and 4B from FIGS. 3A and 3B, several process steps have occurred. For each portion 24, 26, before a spacer 50 is formed along the edges of the gate electrode 48, the substrate 30 may be implanted with ions at the active region 20, 22 in alignment with edges of the gate electrode 48 and edges of the isolation region 32 to form a lightly doped region 52. The lightly doped region 52 may be N type or P type lightly doped region. Typically, if the substrate 30 has a P type well region 36, the lightly doped region 52 will be an N type lightly doped region. And vice versa, if the substrate 30 has an N type well region 36, the lightly doped region 52 likely will be a P type lightly doped region. After the lightly doped region 52 is formed in each portion 24, 26, the spacer 50 is formed in each portion to form the intermediate structure 56 shown in FIGS. 4A and 4B.

Figure 5A:
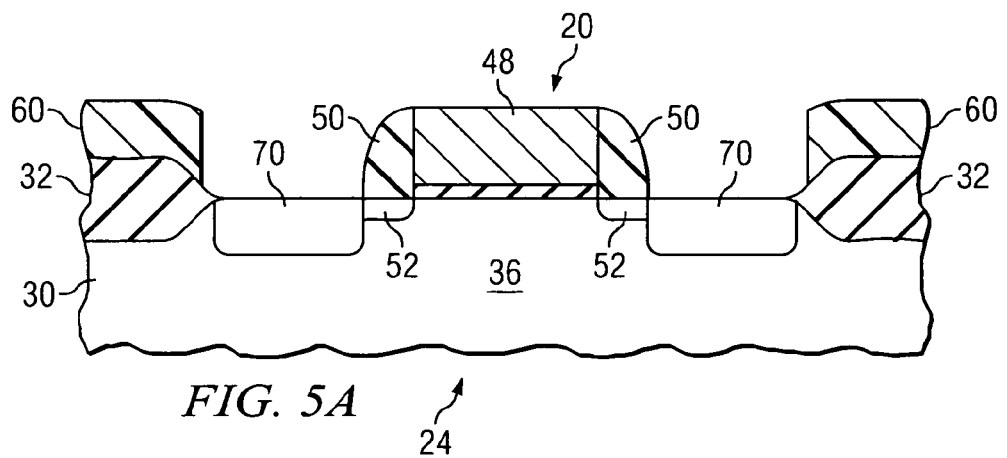
Figure 5B:
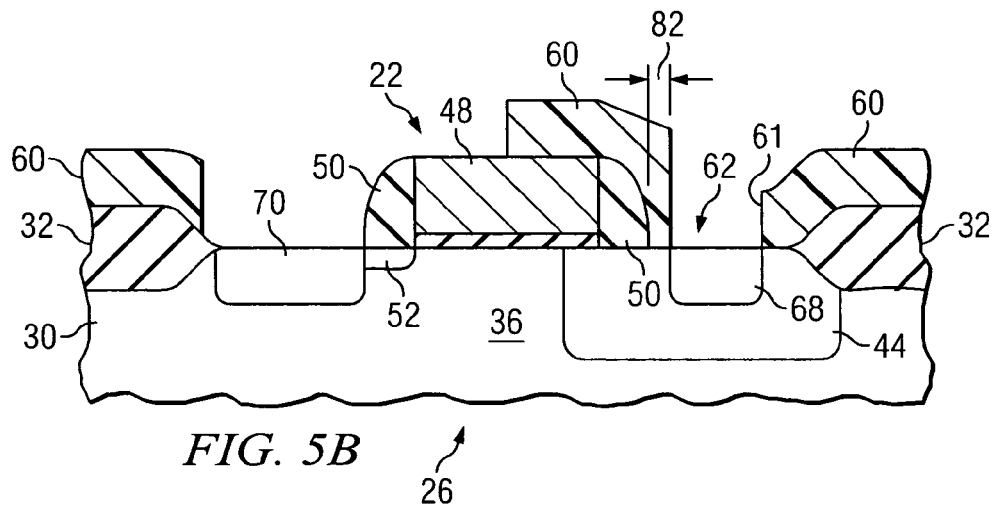

After forming the spacer 50 in each portion 24, 26, a second patterned mask layer 60 is formed over the intermediate structure 56, as shown in FIGS. 5A and 5B. The second mask layer 60 may be made from any of a variety of suitable masking materials, such as photoresist, for example. At the high-voltage portion 26, the second mask layer 60 has a second opening 61 formed therein at a second location 62 in the active region 22. The second location 62 is located within the first location 41. In FIG. 5B, note that the second opening 61 is not aligned with the spacer 50 nor the isolation region 32 in this embodiment. The substrate 30 is implanted with ions at the second location 62 through the second opening 61 to form a second doped region 68. As shown in FIGS. 5A and 5B, other regions 70 are also implanted with ions when the second doped region 68 is implanted with ions. The second doped region 68 and the other doped regions 70 are preferably N+ type or P+ type. Typically, if the substrate 30 has a P type well region 36, the second doped region 68 will be an N+ type doped region. And vice versa, if the substrate 30 has an N type well region 36, the second doped region 68 likely will be a P+ type doped region. The first and second doped regions 44, 68 form a double diffused drain (DDD) structure.

Figure 6A:
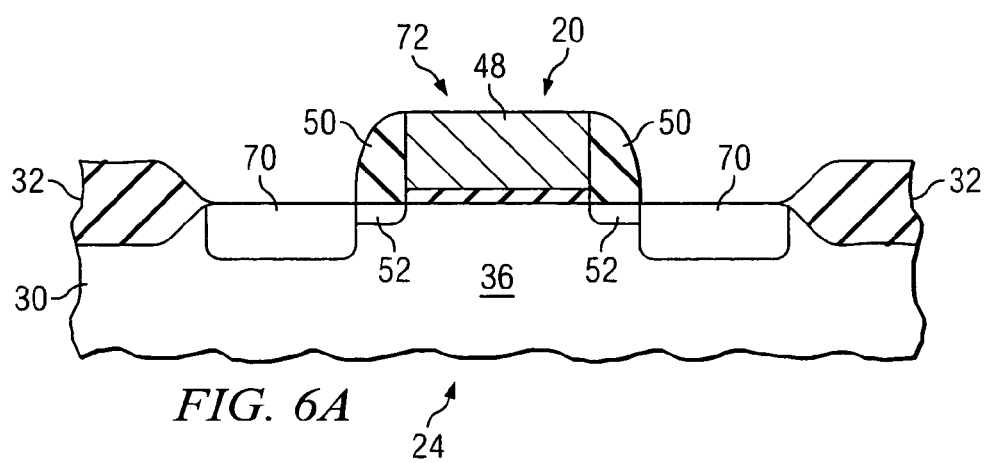
Figure 6B:
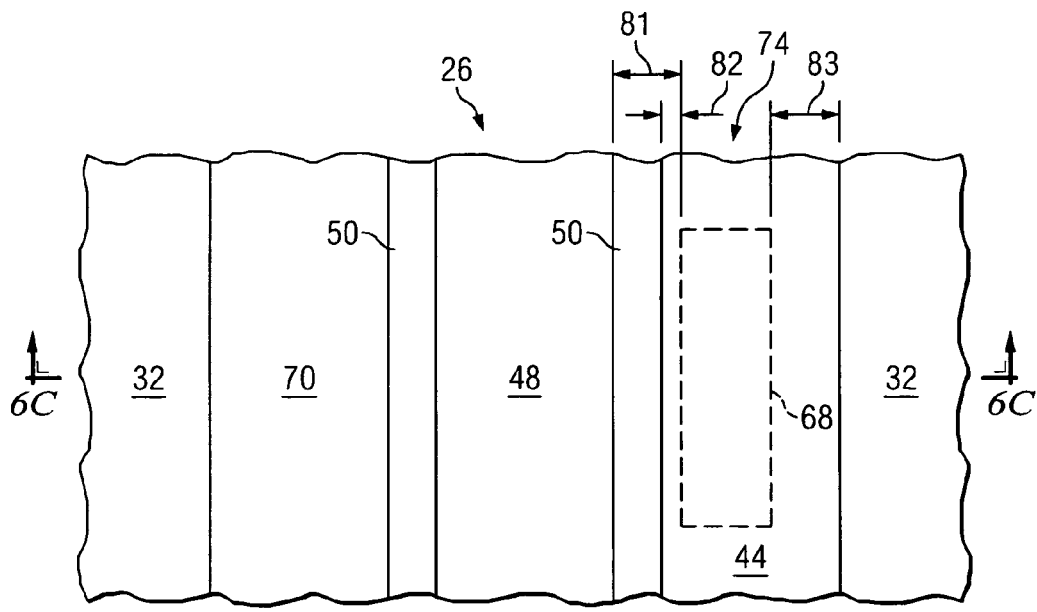
FIG. 6B is a top view of an HVMOS transistor of a preferred embodiment of the present invention.
Figure 6C:
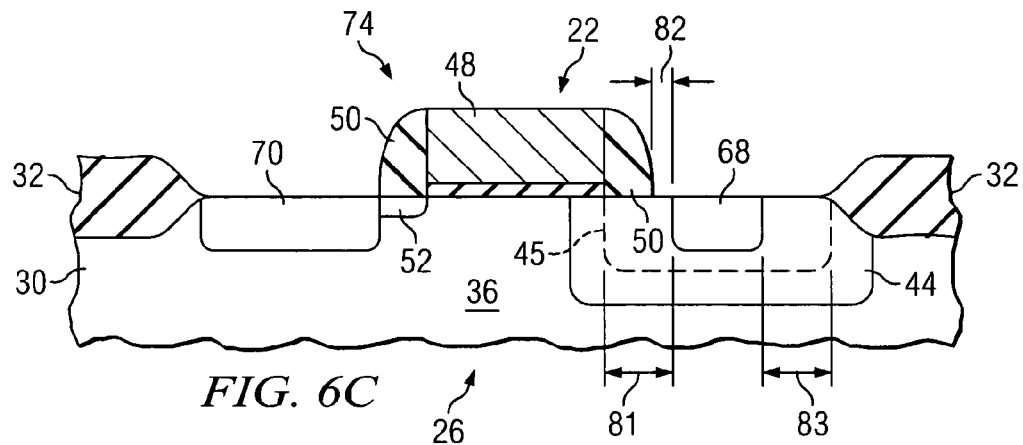

After the second doped region 68 is formed, the second mask layer 60 is removed, as shown in FIGS. 6A-6C. FIGS. 6A-6C show the resulting structures formed by the process of this preferred embodiment illustrated herein. FIG. 6A shows the resulting low-voltage portion 24, which comprises a low voltage MOS transistor 72. FIGS. 6B and 6C show the resulting high-voltage portion 26, which comprises an HVMOS transistor 74. FIG. 6B is a top view, and FIG. 6C is a cross-section view as taken along line 6C-6C in FIG. 6B.

In FIG. 6B, a top view of the second doped region 68 is shown in phantom lines for purposes of illustration. In FIG. 6C, the initial shape of the first doped region 44 (i.e., prior to the thermal drive in step) is also shown in phantom lines 45 for purposes of illustrating the enlargement of the first dope region 44. In FIGS. 6B and 6C, note that a gate-side boundary of the second doped region 68 is separated from a closest edge of the gate electrode 48 by a first spaced distance 81. Also, the gate-side boundary of the second doped region 68 is preferably separated from a closest edge of the spacer 50 by a second spaced distance 82 (the second spaced distance 82 being less than the first spaced distance 81). An isolation-side boundary of the second doped region 68 may be separated from a closest edge of the isolation region 32 by a third spaced distance 83, as shown in FIGS. 6B and 6C, for example. In a preferred embodiment, the third spaced distance 83 is about equal in length to the first spaced distance 81. In other embodiments, however, the third spaced distance 83 may differ from the first spaced distance 81. Also, in other embodiments, the third spaced distance 83 may be less than the second spaced distance 82 or even zero (i.e., there may be no third spaced distance 83), for example. The first spaced distance 81 may vary depending on the desired operation voltage. Generally, an HVMOS transistor 74 designed for a higher operation voltage should have a larger first spaced distance 81. In an embodiment of the present invention where the operation voltage will be less than about 24 volts, the first spaced distance 81 may be about 1.5 µm, for example.

Figure 7:
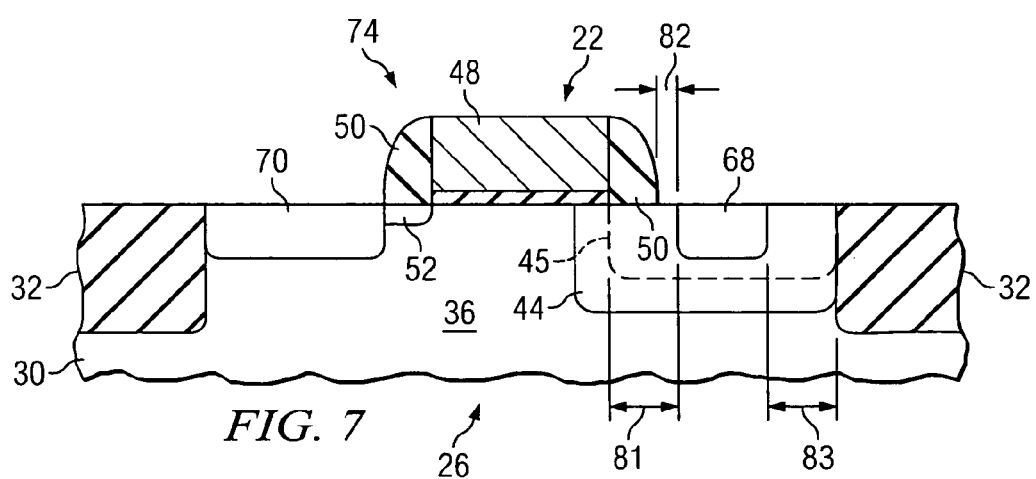
FIG. 7 is a cross-section view of an HVMOS transistor formed in accordance with another preferred embodiment of the present invention.

Although isolation regions 32 of the preferred embodiment shown in FIGS. 1A-6C have a field oxide structure, other structures for the isolation regions 32 may be implemented for other embodiments. FIG. 7 shows a cross-section view for an HVMOS transistor 74 of another embodiment of the present invention. The isolation region 32 of this embodiment in FIG. 7 has a shallow trench isolation structure. In a shallow trench isolation structure, a trench is formed in the substrate 30 and filled with an insulating material. The depth and width of the trench may vary.

The graded boundary of the first doped region 44 for the DDD combined with the first spaced distance 81 separating the second doped region 68 from the gate electrode 48 provides a number of advantages, including (but not necessarily limited to):

Decreased crowding of the electric field and equipotential lines between the drain and gate electrode;
Increased avalanche breakdown voltage;
Reduced hot electron effects at higher voltage loadings;
Increased application voltage;
Reduced likelihood of destruction by electrostatic discharge; and
About a 40-50% improvement of the conducting resistance ($R_{on}$) at the same design rule.

For example, prior HVMOS transistors provided a breakdown voltage of about 22 volts with an application voltage or operation voltage (VDD) between about 12 volts and about 16 volts. Using an embodiment of the present invention, an HVMOS transistor may have a breakdown voltage of about 34 volts and an application voltage between about 18 volts and about 24 volts (and may be used for other application voltages lower than about 24 volts as well, for example). Another advantage that may be provided is that an HVMOS transistor in accordance with an embodiment of the present invention may be provided while allowing the low voltage device to maintain the same performance characteristics as it would without implementing an embodiment of the present invention. As compared to prior process flows for forming an HVMOS transistor in parallel with forming a low voltage MOS transistor, an embodiment of the present invention may be implemented without adding an extra mask.

One of the advantages provided by the thermal drive in step to make the first doped region 44 enlarged and graded is an increased breakdown and operation voltage, as compared to a same device (not shown) formed without the thermal drive in step. For example, if a device was formed using the process shown in FIGS. 1A-6C and having first and third spaced distances 81, 83 of about 1.5 µm each, but without the thermal drive in step, the breakdown voltage for such device may be about 22 volts and the operation voltage may be between about 12 volts and about 16 volts, for example. In comparison, forming a device 74 using an embodiment of the present invention, as shown in FIGS. 1A-6C, and having first and third spaced distances 81, 83 of about 1.5 μm each (i.e., identical but with the added thermal drive in step), the breakdown voltage for such device may be about 34 volts and the operation voltage may be between about 18 volts and about 24 volts, for example. Hence, an embodiment of the present invention may provide a much higher breakdown voltage and operation voltage for the same size device (i.e., using the same amount of real estate on the chip).

Although only an asymmetrical HVMOS transistor has been shown in the example embodiments herein (i.e., DDD on only one side (source or drain) of transistor), in other embodiments of the present invention the source and the drain may both have a DDD structure (i.e., one or both having a DDD in accordance with the present invention), or the HVMOS transistor may be symmetrical (i.e., source and drain both having identical DDD structures), for example. Also note that although the HVMOS transistor is shown herein as being formed-in parallel with a low voltage MOS transistor (as is often the case), an HVMOS transistor may be formed separately, or in parallel with the formation of another device, in another embodiment of the present invention.

It will be appreciated by those skilled in the art having the benefit of this disclosure that embodiments of the present invention provide an improved HVMOS transistor process and structure. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A semiconductor device, comprising:
   a substrate;
   a volume defined as being an active region, wherein at least part of the active region extends into the substrate;
   a gate electrode formed over the substrate, wherein at least part of the gate electrode is located in the active region;
   a spacer formed along edges of the gate electrode;
   a driven-in first doped region formed in the substrate, wherein boundaries of the first doped region are graded, and wherein a gate-side boundary of the first doped region extends laterally below part of the gate electrode; and
   a second doped region formed within the first doped region, wherein a gate-side boundary of the second doped region is spaced away from a closest edge of the gate electrode by a first spaced distance, wherein the gate-side boundary of the second doped region is spaced away from a closest edge of the spacer by a second spaced distance, and wherein the first spaced distance is greater than the second spaced distance.

2. The semiconductor device of claim 1, further comprising a shallow trench isolation region comprising an insulating material formed at least partially in the substrate, wherein at least a majority of the isolation region extends at least partially around the active region.

3. The semiconductor device of claim 1, further comprising an isolation region comprising an insulating material formed at least partially in the substrate, wherein at least a majority of the isolation region extends at least partially around the active region, wherein the isolation region has a field oxide structure.

4. The semiconductor device of claim 1, further comprising an isolation region comprising an insulating material formed at least partially in the substrate, wherein at least a majority of the isolation region extends at least partially around the active region, and wherein an isolation-side boundary of the second doped region is spaced away from a closest edge of the isolation region by a third spaced distance.

5. The semiconductor device of claim 4, wherein the third spaced distance is about equal in length to the first spaced distance.

6. The semiconductor device of claim 1, wherein the semiconductor device comprises a transistor having a breakdown voltage equal to or greater than about 30 volts.

7. The semiconductor device of claim 1, further comprising a lightly doped region formed in the substrate in alignment with the edges of the gate electrode and edges of an isolation region.

8. The semiconductor device of claim 7, wherein the isolation region has a field oxide structure.

9. The semiconductor device of claim 7, Wherein the isolation region has a shallow trench filled with insulating material.

10. A semiconductor device, comprising:
    a transistor, the transistor comprising
      a gate electrode;
      a spacer formed along edges of the gate electrode, the spacer having an outer edge; and
      a drain region comprising
        a first doped region, wherein at least part of the first doped region is underlying at least part of the gate electrode, and
        a second doped region formed in the first doped region and spaced away from the gate electrode, wherein a gate-side boundary of the second doped region is spaced away from a closest edge of the gate electrode by a first spaced distance, wherein the gate-side boundary of the second doped region is spaced away from a closest edge of the spacer by a second spaced distance, and wherein the first spaced distance is greater than the second spaced distance.

11. The semiconductor device of claim 10, wherein the transistor is a high voltage transistor having a breakdown voltage equal to or greater than about 30 volts.

12. The semiconductor device of claim 10, wherein the first doped region is formed in a well of opposite doping type and wherein a depletion region between the first doped region and the well has a width between about 0.8 μm and about 1.0 μm when a bias of about 12 volts is applied.

13. The semiconductor device of claim 10, further comprising an isolation region comprising an insulating material, wherein at least a majority of the isolation region extends at least partially around an active region of the transistor, and wherein an isolation-side boundary of the second doped region is spaced away from a closest edge of the isolation region by an isolation-side spaced distance.

14. The semiconductor device of claim 13, wherein the isolation-side spaced distance is about equal in lateral length to the first spaced distance from the gate electrode to the second doped region.

15. A semiconductor device, comprising:

a high voltage transistor having a breakdown voltage equal to or greater than about 30 volts, the transistor comprising a gate electrode;

a spacer formed along edges of the gate electrode, the spacer having an outer edge;

a well region; and a drain region comprising a first doped region formed in the well region, wherein at least part of the first doped region is underlying at least part of the gate electrode, wherein the first doped region has an opposite doping type than the well region, and wherein a depletion region between the first doped region and the well has a width between about 0.8 µm and about 1.0 µm when a bias of about 12 volts is applied, and a second doped region formed in the first doped region and spaced from the gate electrode, wherein a gate-side boundary of the second doped region is spaced away from a closest edge of the gate electrode by a first spaced distance, wherein the gate-side boundary of the second doped region is spaced away from a closest edge of the spacer by a second spaced distance, and wherein the first spaced distance is greater than the second spaced distance.

16. The semiconductor device of claim 15, further comprising an isolation region comprising an insulating material, wherein at least a majority of the isolation region extends at least partially around an active region of the transistor, and wherein an isolation-side boundary of the second doped region is spaced away from a closest edge of the isolation region by an isolation-side spaced distance.

17. The semiconductor device of claim 16, wherein the isolation-side spaced distance is about equal in lateral length to the first spaced distance from the gate electrode to the second doped region.

18. The semiconductor device of claim 16, wherein the isolation region has a field oxide structure.

19. The semiconductor device of claim 16, wherein the isolation region has a shallow trench filled with insulating material.

* * * * *

UNITED STATES PATENT AND TRADEMARK OFFICE
CERTIFICATE OF CORRECTION

| | |
|---|---|
| PATENT NO. | : 7,525,155 B2 |
| APPLICATION NO. | : 11/387573 |
| DATED | : April 28, 2009 |
| INVENTOR(S) | : Chen et al. |

It is certified that error appears in the above-identified patent and that said Letters Patent is hereby corrected as shown below:

In Col. 5, line 62, delete "dope" and insert --doped--.
In Col. 7, line 22, delete "formed-in" and insert --formed in--.
In Col. 8, line 26, delete "Wherein" and insert --wherein--.

Signed and Sealed this

Second Day of June, 2009

JOHN DOLL
*Acting Director of the United States Patent and Trademark Office*